(12) United States Patent
Wu et al.

(10) Patent No.: US 12,152,310 B2
(45) Date of Patent: Nov. 26, 2024

(54) NICKEL-FREE SEALING OF ANODIZED METAL SUBSTRATES

(71) Applicant: Hewlett-Packard Development Company, L.P., Spring, TX (US)

(72) Inventors: Kuan-Ting Wu, Taipei (TW); Ya-Ting Yeh, Taipei (TW); Chih-Hsiung Liao, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 817 days.

(21) Appl. No.: 16/978,733

(22) PCT Filed: Jun. 22, 2018

(86) PCT No.: PCT/US2018/038987
§ 371 (c)(1),
(2) Date: Sep. 7, 2020

(87) PCT Pub. No.: WO2019/245580
PCT Pub. Date: Dec. 26, 2019

(65) Prior Publication Data
US 2021/0363654 A1 Nov. 25, 2021

(51) Int. Cl.
*C25D 11/24* (2006.01)
*C09D 5/00* (2006.01)
(Continued)

(52) U.S. Cl.
CPC ............ *C25D 11/246* (2013.01); *C09D 5/002* (2013.01); *C09D 7/20* (2018.01); *C09D 183/04* (2013.01);
(Continued)

(58) Field of Classification Search
CPC ...... C25D 11/243; C25D 11/246; C25D 11/18
(Continued)

(56) References Cited

U.S. PATENT DOCUMENTS 2,496,649 A * 2/1950 Zelley ..................... C23C 22/83
148/272
2,909,470 A * 10/1959 Schmidt ................. C25D 11/32
205/108
(Continued)

FOREIGN PATENT DOCUMENTS

CN 101323965 A 12/2008
CN 103215630 7/2013
(Continued)

OTHER PUBLICATIONS

New Technologies for Colour Anodizing, TSC Surface Critical Products Ltd., pp. 1-28.
(Continued)

*Primary Examiner* — Michael C Romanowski
(74) *Attorney, Agent, or Firm* — Shook, Hardy & Bacon L.L.P.

(57) ABSTRACT

The present subject matter relates to Nickel-free (Ni-free) sealing of anodized metal substrates. In an example mentation of the present subject matter, an anodized metal substrate is disposed with a first layer of a Ni-free sealing material over a surface of the anodized metal substrate. Further, a second layer of a second sealing material is disposed atop the first layer to sandwich the first layer of Ni-free sealing material between the surface of the anodized metal substrate and the second layer, to form a sealed metal substrate.

11 Claims, 6 Drawing Sheets

(51) Int. Cl.
    *C09D 7/20*     (2018.01)
    *C09D 183/04*   (2006.01)
    *C25D 11/18*    (2006.01)
    *C25D 11/26*    (2006.01)
    *C25D 11/30*    (2006.01)
    *C25D 11/34*    (2006.01)
    *H05K 5/04*     (2006.01)

(52) U.S. Cl.
    CPC ............ *C25D 11/18* (2013.01); *C25D 11/243* (2013.01); *C25D 11/26* (2013.01); *C25D 11/30* (2013.01); *C25D 11/34* (2013.01); *H05K 5/04* (2013.01)

(58) Field of Classification Search
    USPC ................. 428/34.1–36.92; 361/6, 600–837
    See application file for complete search history.

(56) References Cited

U.S. PATENT DOCUMENTS

| | | | | |
|---|---|---|---|---|
| 3,019,143 | A * | 1/1962 | Dessauer | C25D 11/243 148/244 |
| 3,172,786 | A * | 3/1965 | Kirby | C25D 11/243 205/213 |
| 3,440,150 | A | 4/1969 | Kramer et al. | |
| 4,416,816 | A * | 11/1983 | Grossmann | C09B 45/16 534/602 |
| 4,445,983 | A * | 5/1984 | Gohausen | C25D 11/246 148/272 |
| 4,877,654 | A * | 10/1989 | Wilson | C04B 41/4922 427/393 |
| 5,919,297 | A * | 7/1999 | Chavannes | C25D 11/246 148/272 |
| 6,309,427 | B1 * | 10/2001 | Korte | C25D 11/243 205/333 |
| 6,652,770 | B2 * | 11/2003 | Hayes | B65B 23/10 432/12 |
| 7,442,491 | B2 * | 10/2008 | Sawada | B41N 1/083 148/438 |
| 2007/0092739 | A1 | 4/2007 | Steele et al. | |
| 2009/0208763 | A1 * | 8/2009 | Harris | C04B 41/5007 524/401 |
| 2010/0040786 | A1 | 2/2010 | Dai et al. | |
| 2010/0129560 | A1 * | 5/2010 | Lu | C25D 11/246 427/435 |
| 2011/0250377 | A1 * | 10/2011 | Qin | B32B 27/286 428/458 |
| 2014/0001052 | A1 | 1/2014 | Maloney et al. | |
| 2014/0034115 | A1 * | 2/2014 | Sato | C23C 18/1254 427/372.2 |
| 2014/0116883 | A1 * | 5/2014 | Xiong | C25D 11/243 205/188 |
| 2014/0166490 | A1 * | 6/2014 | Tatebe | C25D 11/22 205/199 |
| 2014/0209471 | A1 * | 7/2014 | Rubin | H01L 31/1884 205/124 |
| 2014/0293513 | A1 * | 10/2014 | Eilertsen | H01G 9/048 216/6 |
| 2015/0140340 | A1 * | 5/2015 | Miao | B05D 3/007 428/416 |
| 2015/0364263 | A1 * | 12/2015 | Petrzilek | H01G 9/012 205/199 |
| 2017/0347476 | A1 * | 11/2017 | Hwang | C25D 11/12 |
| 2019/0112726 | A1 * | 4/2019 | Takaichi | C09D 5/084 |
| 2019/0382911 | A1 * | 12/2019 | Curran | B32B 15/017 |

FOREIGN PATENT DOCUMENTS

| | | | | |
|---|---|---|---|---|
| CN | 103215630 | A * | 7/2013 | |
| CN | 104928749 | | 9/2015 | |
| CN | 104988555 | A * | 10/2015 | |
| CN | 105200489 | | 12/2015 | |
| CN | 105200489 | A * | 12/2015 | |
| CN | 107723776 | | 2/2018 | |
| CN | 107723776 | A * | 2/2018 | ........... C25D 11/246 |
| CN | 107740167 | A * | 2/2018 | ........... C25D 11/246 |
| CN | 107868653 | A * | 4/2018 | ............. C09J 11/04 |
| ES | 2353299 | A1 * | 3/2011 | ........... C04B 35/632 |
| KR | 101270671 | B1 * | 6/2013 | |
| TW | M406615 | | 7/2011 | |
| TW | 201221700 | | 6/2012 | |
| WO | WO-199902759 | A | 1/1999 | |
| WO | WO200003069 | | 1/2000 | |
| WO | WO-2012048107 | | 4/2012 | |
| WO | WO-2017070881 | A1 * | 5/2017 | ........... C25D 11/024 |

OTHER PUBLICATIONS

D.K. Ivanou et al., "Plasma Anodized ZE41 Magnesium Alloy Sealed With Hybrid Epoxy-Silane Coating", Corrosion Science 73 (2013) 300-308.

* cited by examiner

NICKEL-FREE SEALING OF ANODIZED METAL SUBSTRATES

BACKGROUND

Various apparatuses and devices, such as laptops and mobile phones, include an exterior body made of different metal substrates, such as magnesium, aluminum and alloys thereof. Some devices include a housing made from such metal substrates within which different components of the device are housed. Metal substrates are generally anodized to form an oxide layer over the surface of metal substrates to provide resistance to corrosion and wear-and-tear.

BRIEF DESCRIPTION OF DRAWINGS

The following detailed description references the drawings, wherein.

DETAILED DESCRIPTION

Figure 1:
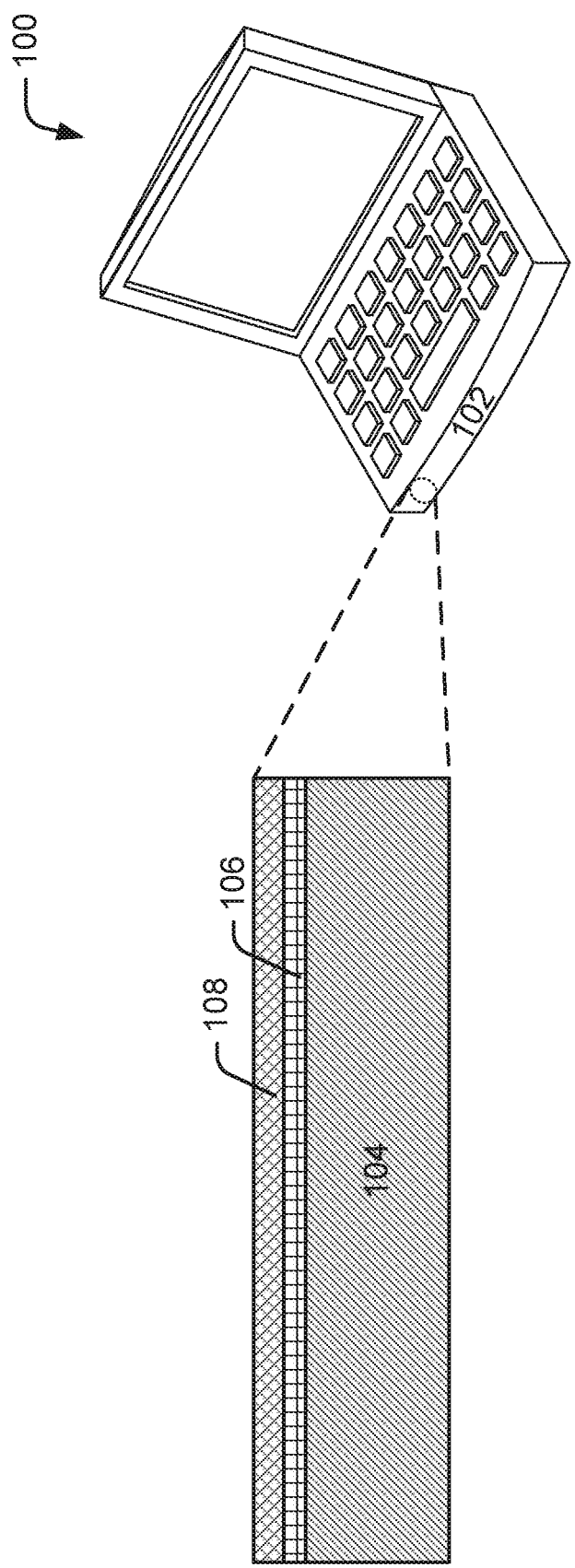
FIG. 1 illustrates a device having a sealed metal substrate, according to an example implementation of the present subject matter.

Metal Substrates are generally anodized to form an oxide layer over surfaces of the metal substrate. Anodization allows the metal substrates to become corrosion and wear-and-tear resistant, thereby improving the longevity of the metal substrates. However, anodization results in formation of micro and nanopores on the surfaces of an anodized metal substrate. Such surface pores allow seepage of corrosive materials into the anodized metal substrates, thereby reducing their resistance to corrosion and wear-and-tear. Thus, the surface pores formed on the surfaces of the anodized metal substrates are sealed by a sealing process to increase the durability and corrosion resistance of the anodized metal substrates.

In the sealing process, surfaces of the anodized metal substrate are coated with a sealing material to form a sealing layer. Generally known sealing materials utilize nickel compounds which, when used in the sealing process, can cause harmful and toxic effects to users, such as contact dermatitis, cancer of lungs, throat, stomach, nose and sinus. While nickel-free (Ni-free) sealing materials are used in some sealing processes, Ni-free sealing materials do not form a durable sealing layer, and thus fail to provide an effective corrosion resistance to the anodized metal substrates.

According to examples of the present subject matter, techniques of providing durable Ni-free sealing of anodized metal substrates are described. The described techniques allow sealing of surface pores within an anodized metal substrate by a non-harmful Ni-free sealing layer, and also provide a durable and corrosion resistant sealing of the surfaces of the anodized metal substrates. In an example implementation of the present subject matter, a two-layer sealing of an anodized metal substrate is performed. A first layer of a Ni-free sealing material is disposed over the surfaces of the anodized metal substrate to seal the surface pores of the anodized metal substrate. Further, a second layer of a second sealing material is disposed over the Ni-free sealing layer to form a sealed metal substrate. The second layer enhances the adhesive property of the first layer, to provide a durable sealed metal substrate.

In an example, the Ni-free sealing material may include a Ni-free amide to seal the surface pores of the anodized metal substrate. Such Ni-free amides may be formed by a combination of selected acetic acid, propionic acid, butanoic acid and pentanoic acid along with ammonia, methylamine, ethylamine and propylamine. The second layer may include a combination of tetraethoxysilane ($Si(OC_2H_5)_4$) and long chain silane polymer solution to enhance the adhesive property of the Ni-free amides and also provide a durable second layer.

Thus, the described techniques allow for deposition of Ni-free sealing layers onto anodized metal substrates, while providing durability and corrosion resistance to the anodized metal substrates, while also avoiding harmful and toxic effects on users.

The above techniques are further described with reference to FIGS. 1-6. It should be noted that the description and the figures merely illustrate the principles of the present subject matter along with examples described herein, and should not be construed as a limitation to the present subject matter. It is thus understood that various arrangements may be devised that, although not explicitly described or shown herein, embody the principles of the present subject matter. Moreover, all statements herein reciting principles, aspects, and implementations of the present subject matter, as well as specific examples thereof, are intended to encompass equivalents thereof.

FIG. 1 illustrates a device 100 having a sealed metal substrate, according to an example implementation of the present subject matter. The device 100 may include components such as a chassis or housing formed of a sealed metal substrate 102. In an example of the present subject matter, the sealed metal substrate 102 includes an anodized metal substrate 104 covered with a first layer 106 of Ni-free sealing material and a second layer 108 of second sealing material, such that the first layer 106 of Ni-free sealing material is sandwiched between a surface of the anodized metal substrate 104 and the second layer 108.

In an example of the present subject matter, the sealed metal substrate 102 provides a durable surface to the device 100, resistant from corrosion and wear-and-tear. The first layer 106 of the Ni-free sealing material seals surface pores of the anodized metal substrate 104, while the second layer 108 of the second sealing material forms a durable layer to bind the Ni-free sealing material with the anodized metal substrate 104 and protect the sealed metal substrate 102 from corrosion.

The device 100, including the sealed metal substrate 102, may be implemented as any one of, but not limited to, a laptop, a desktop, a mobile phone, a smartphone, a tablet, a phablet, or any other devices utilizing the sealed metal substrate 102, such as a keyboard, a mouse, a printer, and a liquid crystal display monitor. Further, the sealed metal substrate 102 may be used to form different structures of the device 100, such as housings, chassis, coverings, body protectors, covers, casings, frames, and guards.

In an example, the anodized metal substrate 104 is formed by anodizing any metal, including but not limited to, aluminum, magnesium, titanium, zinc, niobium, zirconium, hafnium, tantalum, and alloys thereof.

In an example of the present subject matter, the first layer 106 of the Ni-free sealing material is a Ni-free amide to seal the surface pores of the anodized metal substrate 104. The Ni-free amide may be formed by a combination of one or more of acetic acid, propionic acid, butanoic acid and pentanoic acid along with ammonia, methylamine, ethylamine and propylamine. It would be noted that the combination of one or more of acetic acid, propionic acid, butanoic acid and pentanoic acid along with ammonia, methylamine, ethylamine and propylamine may form an amide, utilized as the Ni-free sealing material to form the first layer 106. The amide sealing material may seal the surface pores of the anodized metal substrate 104 while adhering with the surface of the anodized metal substrate 104.

In another example, the second sealing material to form the second layer 108 may include a combination of tetraethoxysilane $(Si(OC_2H_5)_4)$ and long chain silane polymer solution. The combination of the tetraethoxysilane $(Si(OC_2H_5)_4)$ and long chain silane polymer solution enhances the adhesive property of Ni-free amides with the anodized metal substrate 104, and may, therefore, allow effective adhesion of the first layer 106 with surfaces of the anodized metal substrate 104.

Figure 2:
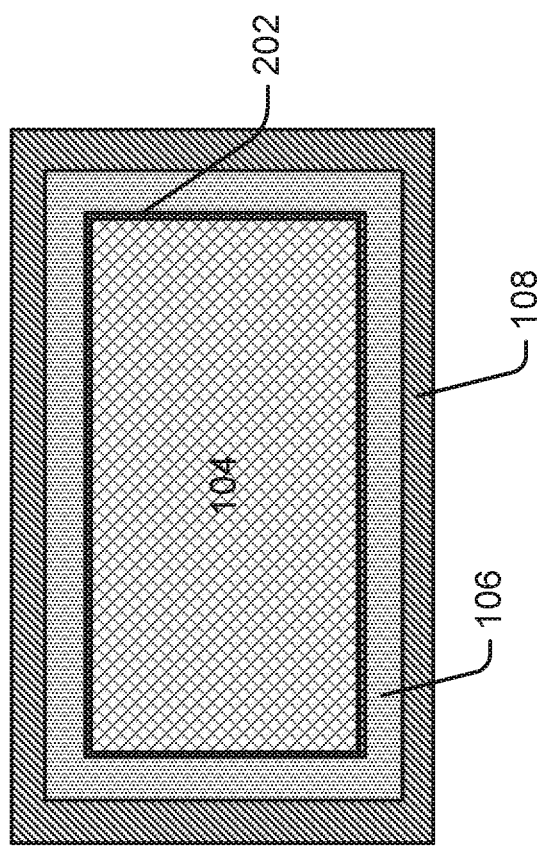
FIG. 2 illustrates a sealed metal substrate, according to an example implementation of the present subject matter.

FIG. 2 depicts a sealed metal substrate 102, according to an example implementation of the present subject matter. In the example implementation, the sealed metal substrate 102 includes an anodized metal substrate 104 coated with layers of coloring agents and sealing materials. In an example, the anodized metal substrate 104 is coated with a layer of a coloring agent 202, deposited on surfaces of the anodized metal substrate 104. The layer of the coloring agent 202 may impart color to the anodized metal substrate 104. It would be noted that the coloring agent 202 may be deposited into the surface pores of the anodized metal substrate 104 and may provide color to the anodized metal substrate 104.

Further, the sealed metal substrate 102 further includes a first layer 106 of a Ni-free sealing material coated over the layer of the coloring agent 202. The first layer 106 of the Ni-free sealing material may seal the surface pores on the surfaces of the anodized metal substrate 104. In an example, the first layer 106 of the Ni-free sealing material is a Ni-free amide to seal the surface pores of the anodized metal substrate 104. The Ni-free amide may be formed by a combination of one or more of acetic acid, propionic acid, butanoic acid and pentanoic acid along with ammonia, methylamine, ethylamine and propylamine. It would be noted that the combination of one or more of acetic acid, propionic acid, butanoic acid and pentanoic acid along with ammonia, methylamine, ethylamine and propylamine may form an amide, utilized as the Ni-free sealing material to form the first layer 106. For example, acetic acid may be combined with methylamine to form an amide. The thus formed amide may seal the surface pores of the anodized metal substrate 104 while adhering with the surface of the anodized metal substrate 104.

The sealed metal substrate 102 further includes a second layer 108 of a second sealing material coated over the first layer 106 of Ni-free sealing material. The second layer 108 may provide a durable and corrosion resistant layer to the sealed metal substrate 102. In an example of the present subject matter, the second sealing material that forms the second layer 108 may include a combination of tetraethoxysilane $(Si(OC_2H_5)_4)$ and long chain silane polymer solution, where the long chain silane polymer solution comprises of about 0.1 to 5 percent silane polymers in alcohol and water co-solvent.

Figure 3:
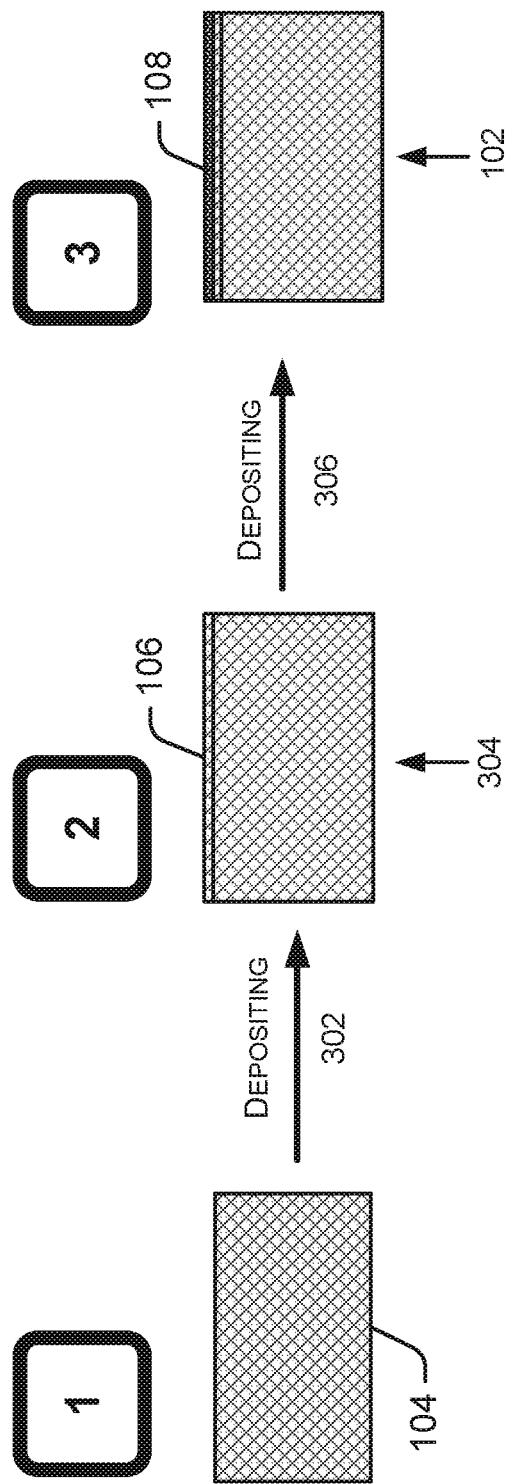
FIG. 3 illustrates different stages of preparation of a sealed metal substrate, according to an example implementation of the present subject matter.

FIG. 3 illustrates different stages of preparation of a sealed metal substrate 102, according to an example implementation of the present subject matter. In an example, the anodized metal substrate 104 is utilized to form the sealed metal substrate 102. The different stages of fabrication of the sealed metal substrate are marked from stage 1 to stage 3.

At stage 1, the anodized metal substrate 104 is obtained, A metal substrate or a metal alloy substrate, such as aluminum, magnesium, titanium, zinc, niobium, zirconium, hafnium, tantalum, and alloys thereof may be anodized to form the anodized metal substrate 104. During the anodization process, the metal substrate may be processed through polishing, degreasing, activating, and neutralizing processes, prior to the anodization.

The surfaces of the metal substrate may be polished using polishing agents, such as abrasives to remove surface irregularities, such as burrs on the surfaces of the metal substrate. In an example implementation, the surfaces of the metal substrate may be polished through one of electro-polishing, mechanical polishing, and buffing.

Upon polishing, the surfaces of the metal substrate may be degreased to remove impurities, such as fat, grease, and oil. In an example implementation, the surfaces of the metal substrate may be degreased through ultrasonic degreasing by using alkaline cleaners. The surfaces of the metal substrate may also be degreased by passing hot water over the metal substrate.

Upon degreasing, the surfaces of metal substrate may be activated to remove any layer of natural oxides that may have formed on the metal substrate due to exposure to the atmosphere. In an example implementation, the surfaces of metal substrate may be activated through acid activation. Acids, such as nitric acid, acetic acid, and sulfuric acid may be used for acid activation. Add activation also removes alkaline solutions that may get stuck to the metal substrate while the metal substrate is degreased using alkaline cleaners.

Upon activation, the surfaces of the metal substrate may be neutralized. In an example implementation, the surfaces of the metal substrate may be neutralized through alkaline neutralization using weak alkaline solutions, such as alkaline solutions of one of sodium carbonate, sodium hydroxide, ammonia and sodium hexametaphosphate.

Once the metal substrate is processed and ready for anodization, the metal substrate may be anodized to form an oxide layer on the metal substrate and generate the anodized metal substrate 104. Further, the anodized metal substrate 104 is subjected to depositing 302 of a first layer 106 of Ni-free sealing material, to form an intermediary sealed metal substrate 304. The intermediary sealed metal substrate 304 may include the first layer 106 deposited onto at least one surface of the anodized metal substrate 104 to cover surface pores of the anodized metal substrate 104.

The depositing 302 of the first layer 106 onto a surface of the anodized metal substrate 104 may be done from any of the various known mechanisms of depositing thin layers, such as chemical deposition, physical deposition, etc. The process of chemical deposition of the first layer 106 may include any one of planting, chemical solution deposition, Langmuir-Blodgett method, spin coating, dip coating, and chemical vapor deposition. Similarly, any of the physical deposition process, such as physical vapor deposition, spray coating and electrospray deposition may be used for the deposition of the first layer 106.

At stage 2, the intermediary sealed metal substrate 304 is subjected to depositing 306 to form the second layer 108 of the second sealing material over the first layer 106.

The deposition of the second sealing material may also be based on techniques including, but not limited to, chemical deposition techniques and physical deposition techniques. Thus, the deposition of the second layer 108 may generate the sealed metal substrate 102 where the surface pores of the anodized metal substrate 104 are sealed with Ni-free durable sealing layers.

In an example of the present subject matter, the sealed metal substrate 102 may also be further subjected to a baking or curing process where the sealed metal substrate 102 is heated to about 50° to 100° centigrade, for about 15 to 60 minutes.

Figure 4:
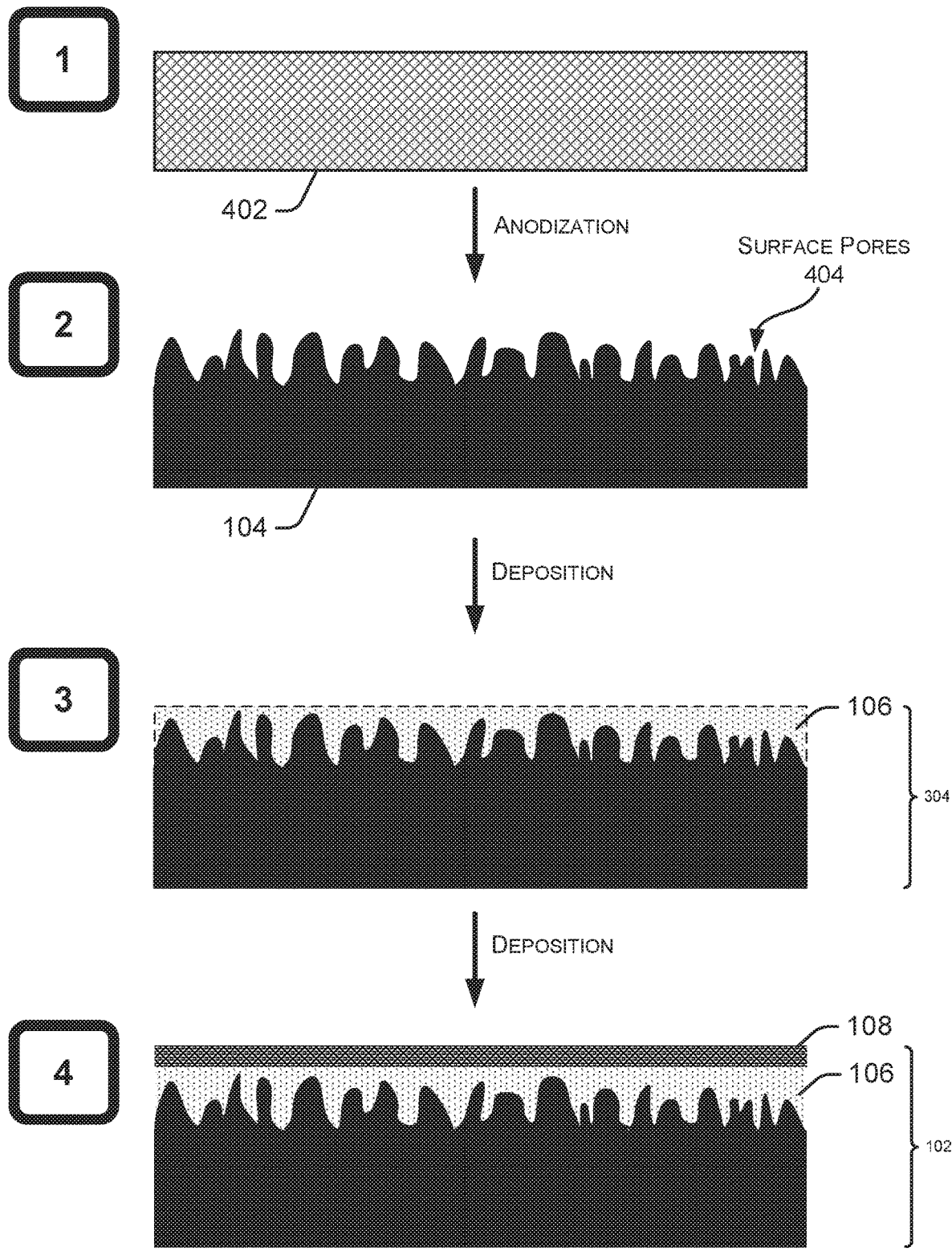
FIG. 4 illustrates different stages of preparation of a sealed metal substrate, according to an example implementation of the present subject matter.
Figure 5:
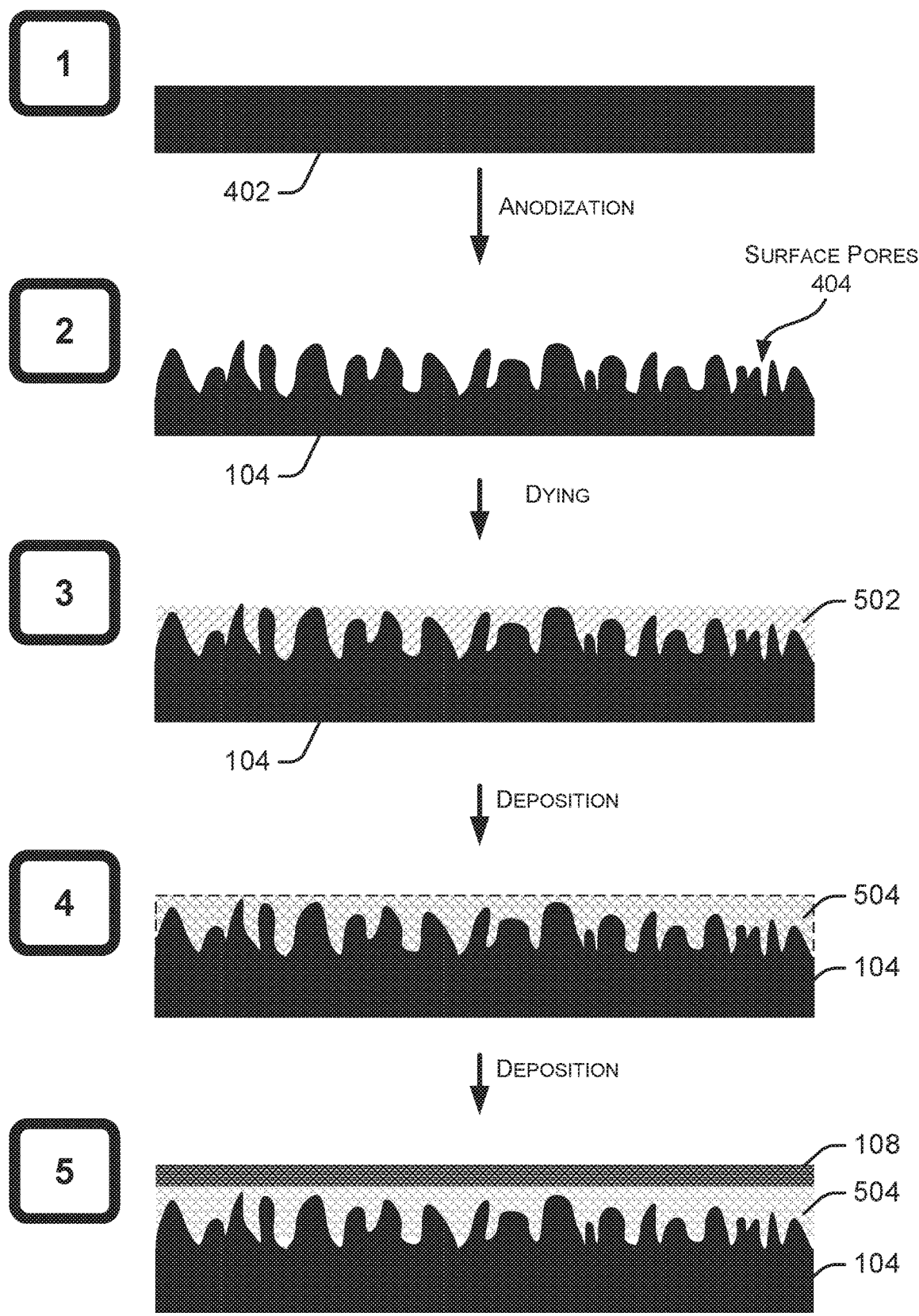
FIG. 5 illustrates different stages of preparation of a sealed metal substrate, according to an example implementation of the present subject matter.

The filling of surface pores of the anodized metal substrate 104 through the sealing process, is further described through FIGS. 4 and 5.

FIG. 4 illustrates different stages of preparation of a sealed metal substrate, according to an example implementation of the present subject matter. The different stages of fabrication of the sealed metal substrate are marked from stage 1 to stage 4.

At stage 1, a metal substrate 402 or a metal alloy substrate is obtained. The metal substrate 402 or a metal alloy substrate may include any metal including, but not limited to, aluminum, magnesium, titanium, zinc, niobium, zirconium, hafnium, tantalum, and alloys thereof.

At stage 2, the anodized metal substrate 104 is obtained by subjecting the metal substrate 402 to an anodization process. As explained earlier, prior to the anodization process, the metal substrate 402 may be processed through polishing, degreasing, activating, and neutralizing processes.

The anodization of the metal substrate 402 may include electrolysis of an electrolyte solution with the metal substrate 402 immersed in the electrolyte solution. The electrolyte solution may be an acidic solution of one of sulfuric acid, chromic acid, nitric acid, and phosphoric acid. In an example implementation, the electrolyte solution may include a concentration in a range of about 3% by volume to about 15% by volume and has a pH in a range of about 3 to about 5.

In an example implementation, the electrolyte solution may be kept inside an electrolytic bath and maintained at a temperature in a range of about 10° C. to about 45° C. The metal substrate 402 is immersed in the electrolyte solution inside the electrolytic bath. The metal substrate 402 acts as an electrode during electrolysis of the electrolyte solution. For electrolysis, an electrical signal at a voltage in a range of about 60 volts to about 250 volts may be periodically passed through the electrolyte solution. In an example implementation, periodically passing the electrical signal includes passing the electrical signal through the electrolyte solution for a time duration in a range of about 2 minutes to about 3 minutes and then cutting off the electrical signal for a time duration in a range of about 5 seconds to about 20 seconds. This process of passing the electrical signal through the electrolyte solution and cutting off the electrical signal may be repeatedly performed for a definite time period of, for example, 20 minutes. At the end of the electrolysis, an oxide layer may be formed on the metal substrate 402.

The thickness of the oxide layer may depend on the definite time period for which the electrolysis is performed. In an example implementation, the oxide layer has a thickness in a range of about 3 μm to about 15 μm. The oxide layer may be formed of a metal oxide, or a combination of metal oxides. For example, when the metal substrate 402 is aluminum, the oxide layer is formed of aluminum oxide ($Al_2O_3$). In another example, when the metal substrate is an alloy of magnesium, aluminum, and zinc, then the oxide layer is formed of a combination of magnesium oxide, aluminum oxide, and zinc oxide.

In an example implementation of the present subject matter, the anodized metal substrate 104 may be heated at a temperature in a range of 60° C. to 80° C. for a time duration in a range of 10 minutes to 30 minutes, to dry the oxide layer. After the oxide layer is formed on the metal substrate 402, the anodized metal substrate 104 may be formed at stage 2.

As depicted in FIG. 4, the anodization of the metal substrate 402 may cause formation of surface pores 404 on the surface of the anodized metal substrate 104. The surface pores 404 are then sealed by deposition of sealing material layers. In an example of the present subject matter, at stage 3, the first layer 106 of Ni-free sealing material is deposited onto the surface of the anodized metal substrate 104 to cover the surface pores 404.

In an example, the first layer 106 of the Ni-free sealing material is a Ni-free amide to seal the surface pores of the anodized metal substrate 104. The Ni-free amide may be formed by a combination of one or more of acetic acid, propionic acid, butanoic acid and pentanoic acid along with ammonia, methylamine, ethylamine and propylamine. It would be noted that the combination of one or more of acetic acid, propionic acid, butanoic acid and pentanoic acid along with ammonia, methylamine, ethylamine and propylamine may form an amide, utilized as the Ni-free sealing material to form the first layer 106. For example, in an aluminum substrate where the anodized aluminum substrate includes a layer of aluminum oxide ($Al_2O_3$), the Ni-free amide compound may include amine group ($-NH_2$) and the hydroxyl group ($-OH$). The amine group ($-NH_2$) and the hydroxyl group ($-OH$) may provide bonding force with Aluminum ions ($Al^{3+}$) on the surfaces of the anodized aluminum substrate.

Further, the first layer 106 is covered and coated with a second layer 108 of the second sealing material. The second layer 108 may provide a durable and corrosion resistant layer over the first layer 106. In an example of the present subject matter, the second sealing material to form the second layer 108 may include a combination of tetraethoxysilane ($Si(OC_2H_5)_4$) and long chain silane polymer solution, where the long chain silane polymer solution comprises of about 0.1 to 5 percent silane polymers in alcohol and water co-solvent. Thus, by coating the second layer 108 onto the first layer 106, the sealed metal substrate 102 is formed.

FIG. 5 illustrates different stages of preparation of a sealed metal substrate, according to an example implementation of the present subject matter. The different stages of fabrication of the sealed metal substrate are marked from stage 1 to stage 5. At stage 1, the metal substrate 402 is obtained. As described earlier, the metal substrate 402 may be an aluminum or a magnesium substrate. Further, the metal substrate 402 is anodized to generate the anodized metal substrate 104 at stage 2. The anodized metal substrate 104 includes surface pores 404 formed due to the anodization process.

In an example of the present subject matter, the anodized metal substrate 104 is then dyed with a coloring agent 202 at stage 3 to impart color to the anodized metal substrate 104. The coloring agent 202 may be filled into the surface pores 404 of the anodized metal substrate 104. The coloring agent 202 may form a layer 502 over the surface pores of the anodized metal substrate 104. Further, the dyed anodized metal substrate 104 may be subjected to deposition of the first layer 106 and the second layer 108 at stages 4 and 5, respectively. The deposition of the first layer 106 of Ni-free sealing material may fill the surface pores 404 on the surface of the anodized metal substrate 104, along with also sealing the coloring agent 202 onto the surface of the anodized metal substrate 104. Accordingly, a layer 504 may be formed over the anodized metal substrate 104, including the coloring agent 202 and the Ni-free sealing material.

Further, the second layer 108 of the second sealing material may adhere the layer 504 to the surface of the anodized metal substrate 104 and may also provide durability to the generated sealed metal substrate 102.

Figure 6:
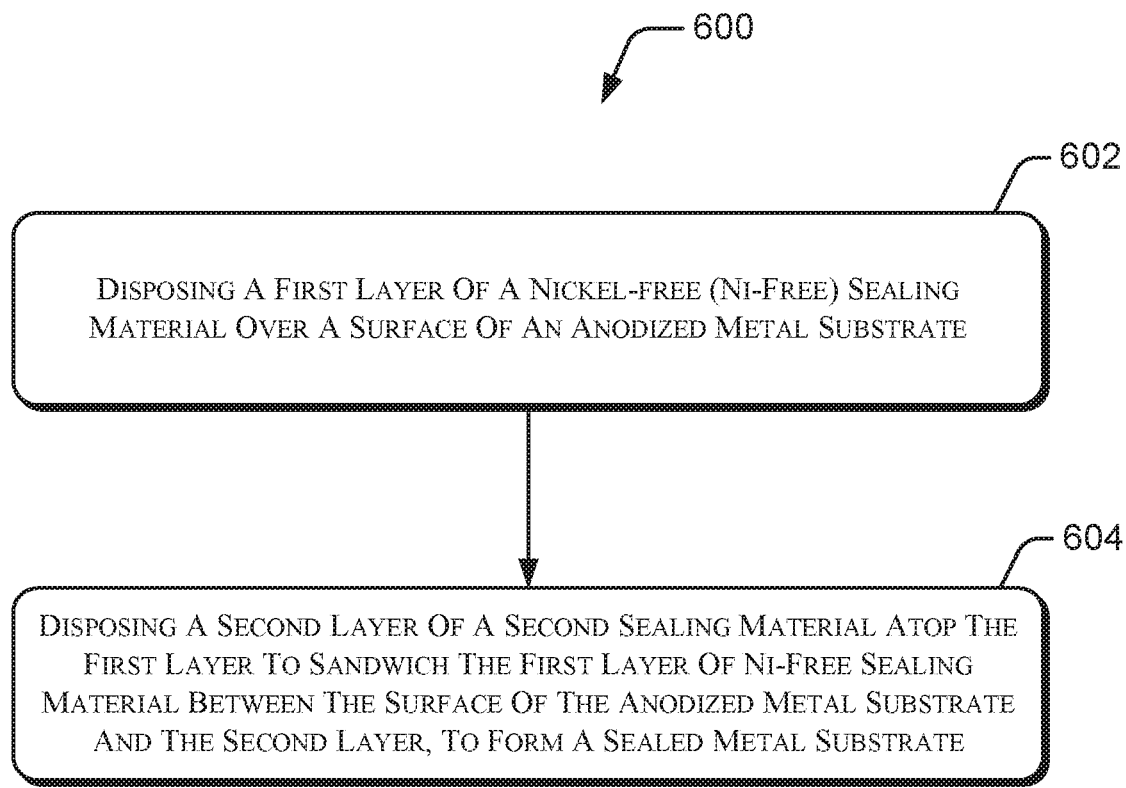
FIG. 6 illustrates a method of fabricating a sealed metal substrate, according to an example implementation of the present subject matter.

FIG. 6 illustrate a method 600 of fabricating a sealed metal substrate, according to an example implementation of the present subject matter. The order in which the method 600 is described is not intended to be construed as a limitation, and any number of the described method blocks may be combined in any order to implement the method 600, or any alternative methods. Furthermore, the method 600 may be implemented with utilization of automated computer driven devices through any suitable hardware, program, or combination thereof.

Referring to FIG. 6, at block 602, a first layer of a Ni-free sealing material is disposed over a surface of an anodized metal substrate. In an example of the present subject matter, the first layer of the Ni-free sealing material is a Ni-free amide compound formed by a combination of one or more of acetic acid, propionic acid, butanoic acid and pentanoic acid along with ammonia, methylamine, ethylamine and propylamine. The Ni-free amide compound may seal the surface pores of the anodized metal substrate and thereby form a sealing layer on the surface of the anodized metal substrate.

At block 604, a second layer of a second sealing material is disposed atop the first layer to sandwich the first layer of Ni-free sealing material between the surface of the anodized metal substrate and the second layer, to form a sealed metal substrate.

In an example of the present subject matter, the second sealing material to form the second layer may include a combination of tetraethoxysilane ($Si(OC_2H_5)_4$) and long chain silane polymer solution. The combination of the tetraethoxysilane ($Si(OC_2H_5)_4$) and long chain silane polymer solution enhances the adhesive property of Ni-free amides with the anodized metal substrate, and may therefore, allow effective adhesion of the first layer with surfaces of the anodized metal substrate.

Although examples for the present disclosure have been described in language specific to structural features and/or methods, it should be understood that the appended claims are not necessarily limited to the specific features or methods described. Rather, the specific features and methods are disclosed and explained as examples of the present disclosure.

We claim:

1. A sealed metal substrate, comprising:
    an anodized metal substrate dyed with a coloring agent to impart color to the anodized metal substrate, the anodized metal substrate having surface pores;
    a first sealing material consisting of a Nickel-free (Ni-free) amide disposed over the anodized metal substrate to seal the surface pores of the anodized metal substrate, wherein the Ni-free amide is formed from a combination of i) one of acetic acid, propionic acid, butanoic acid, and pentanoic acid and ii) one of ammonia, methylamine, ethylamine, and propylamine; and
    a second sealing material disposed over the first sealing material.

2. The sealed metal substrate as claimed in claim 1, wherein the second sealing material is a combination of tetraethoxysilane ($Si(OC_2H_5)_4$) and a long chain silane polymer solution.

3. The sealed metal substrate as claimed in claim 2, wherein the long chain silane polymer solution comprises about 0.1 percent to 5 percent silane polymers in alcohol and water co-solvent.

4. A device, comprising:
    a housing, wherein the housing comprises:
    an anodized metal substrate dyed with a coloring agent to impart color to the anodized metal substrate, the anodized metal substrate having surface pores;
    a first sealing material consisting of a Nickel-free (Ni-free) amide disposed over the anodized metal substrate to seal the surface pores of the anodized metal substrate, wherein the Ni-free amide is formed from a combination of i) one of acetic acid, propionic acid, butanoic acid, and pentanoic acid and ii) one of ammonia, methylamine, ethylamine, and propylamine; and
    a second sealing material disposed over the first sealing material.

5. The device as claimed in claim 4, wherein the second sealing material is a combination of tetraethoxysilane ($Si(OC_2H_5)_4$) and a long chain silane polymer solution.

6. The device as claimed in claim 5, wherein the long chain silane polymer solution comprises about 0.1 percent to 5 percent of silane polymers in an alcohol and water co-solvent.

7. A method, comprising:
    combining i) one of acetic acid, propionic acid, butanoic acid, and pentanoic acid with ii) one of ammonia, methylamine, ethylamine, and propylamine to form a first sealing material consisting of a Nickel-free (Ni-free) amide;
    dying an anodized metal substrate with a coloring agent to impart color to the anodized metal substrate, wherein the anodized metal substrate has a surface including surface pores;
    disposing the first sealing material over the surface of the anodized metal substrate to seal the surface pores of the anodized metal substrate;
    disposing a second sealing material atop the first sealing material to sandwich the first sealing material between the surface of the anodized metal substrate and the second sealing material to form a sealed metal substrate.

8. The method as claimed in claim 7, further comprising combining tetraethoxysilane ($Si(OC_2H_5)_4$) and a long chain silane polymer solution to form the second sealing material.

9. The method as claimed in claim 8, wherein the long chain silane polymer solution comprises about 0.1 percent to 5 percent of silane polymers in an alcohol and water co-solvent.

10. The method as claimed in claim 7, further comprising baking the anodized metal substrate to a temperature of about 50° centigrade to 100° centigrade for a duration of about 15 minutes to 60 minutes.

11. The method as claimed in claim 7, further comprising dying the anodized metal substrate with the coloring agent prior to the disposing of the first sealing material.

* * * * *